(12) United States Patent
Amit et al.

(10) Patent No.: US 10,423,596 B2
(45) Date of Patent: Sep. 24, 2019

(54) EFFICIENT CACHING OF HUFFMAN DICTIONARIES

(71) Applicant: INTERNATIONAL BUSINESS MACHINES CORPORATION, Armonk, NY (US)

(72) Inventors: Jonathan Amit, Omer (IL); Nir Halowani, Holon (IL); Chaim Koifman, Rishon Lezion (IL); Shai Tahar, Petach Tikva (IL)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 710 days.

(21) Appl. No.: 14/177,690

(22) Filed: Feb. 11, 2014

(65) Prior Publication Data

US 2015/0227565 A1 Aug. 13, 2015

(51) Int. Cl.
| | | |
|---|---|---|
| *G06F 7/00* | (2006.01) | |
| *G06F 16/22* | (2019.01) | |
| *H03M 7/40* | (2006.01) | |
| *H03M 7/30* | (2006.01) | |
| *H04L 29/06* | (2006.01) | |
| *H04L 29/08* | (2006.01) | |

(52) U.S. Cl.
CPC ...... *G06F 16/2246* (2019.01); *H03M 7/3086* (2013.01); *H03M 7/40* (2013.01); *H03M 7/607* (2013.01); *H03M 7/6088* (2013.01); *H04L 69/04* (2013.01); *G06F 2212/401* (2013.01); *H04L 67/2842* (2013.01)

(58) Field of Classification Search
CPC .............................................. G06F 2212/401
USPC .......................................................... 707/693
See application file for complete search history.

(56) References Cited

U.S. PATENT DOCUMENTS

| | | | |
|---|---|---|---|
| 5,821,887 A | 10/1998 | Zhu | |
| 5,970,177 A | 10/1999 | Chinnock | |
| 6,195,674 B1 * | 2/2001 | Elbourne | G06F 9/3879 708/401 |
| 6,295,604 B1 * | 9/2001 | Callum | H04L 63/0428 713/160 |
| 7,307,552 B2 | 12/2007 | Ma et al. | |
| 7,764,205 B2 * | 7/2010 | Owsley | H03M 7/40 341/106 |
| 7,796,059 B2 | 9/2010 | Ylonen | |
| 7,860,328 B2 | 12/2010 | Mattausch et al. | |
| 8,037,035 B2 * | 10/2011 | Kataoka | G06F 17/30132 707/623 |
| 8,589,373 B2 * | 11/2013 | Mayer | G06F 16/951 707/706 |
| 8,593,308 B1 * | 11/2013 | Biran | H03M 7/405 341/106 |
| 2007/0277036 A1 * | 11/2007 | Chamberlain | G06F 9/4881 713/171 |

(Continued)

OTHER PUBLICATIONS

Rigler, et al., "FPGA-Based Lossless Data Compression using Huffman and LZ77 Algorithms" pp. 1235-1238, Canadian Conference on Electrical and Computer Engineering, 2007, IEEE, 2007.

*Primary Examiner* — Eliyah S. Harper
(74) *Attorney, Agent, or Firm* — Griffiths & Seaton PLLC

(57) ABSTRACT

A Huffman cache is used to hold Huffman dictionaries that are changeable for dynamically selecting literal frequencies that are similar, wherein the Huffman cache is a data storage cache.

18 Claims, 6 Drawing Sheets

(56) References Cited

U.S. PATENT DOCUMENTS

| | | | | |
|---|---|---|---|---|
| 2008/0177994 | A1* | 7/2008 | Mayer | G06F 9/4418 713/2 |
| 2010/0161590 | A1* | 6/2010 | Zheng | G06F 17/30902 707/722 |
| 2012/0288088 | A1* | 11/2012 | Chang | H04L 9/0618 380/28 |
| 2013/0039566 | A1* | 2/2013 | Reznick | G06T 9/005 382/154 |
| 2013/0125121 | A1* | 5/2013 | White | G06F 9/4856 718/1 |
| 2013/0135122 | A1* | 5/2013 | Glass | H03M 7/6076 341/65 |
| 2013/0325821 | A1* | 12/2013 | Amit | G06F 11/1453 707/692 |
| 2015/0113220 | A1* | 4/2015 | Amit | H03M 7/42 711/122 |

* cited by examiner

EFFICIENT CACHING OF HUFFMAN DICTIONARIES

BACKGROUND OF THE INVENTION

Field of the Invention

The present invention relates in general to computers, and more particularly to efficient caching of Huffman dictionaries in a computing environment.

Description of the Related Art

In today's society, computer systems are commonplace. Computer systems may be found in the workplace, at home, or at school. Computer systems may include data storage systems, or disk storage systems, to process and store data. Large amounts of data have to be processed daily and the current trend suggests that these amounts will continue being ever-increasing in the foreseeable future. Computers are very powerful tools for storing and providing access to vast amounts of information and are often time networked together. The computing networking industry uses compression to lower the network bandwidth requirements for growing portions of the internet traffic. Recently, the primary storage industry started using compression to lower the exponentially growing storage capacity requirements. Huffman encoding is a key part of standard compression algorithms. It has two versions, one for optimal quality (e.g., ratio) and the other for optimal performance (e.g., rate). However, a need exists for increased computing efficiency for caching of Huffman dictionaries.

SUMMARY OF THE DESCRIBED EMBODIMENTS

In one embodiment, a method is provided for efficient caching of Huffman dictionaries using a processor device in a computing environment. In one embodiment, by way of example only, a Huffman cache is used to hold the Huffman dictionaries that are changeable for dynamically selecting literal frequencies that are similar. The Huffman cache is a data storage cache.

In another embodiment, a computer system is provided for efficient caching of Huffman dictionaries using a processor device, in a computing environment. The computer system includes a computer-readable medium and a processor in operable communication with the computer-readable medium. In one embodiment, by way of example only, the processor uses a Huffman cache to hold the Huffman dictionaries that are changeable for dynamically selecting literal frequencies that are similar. The Huffman cache is a data storage cache.

In a further embodiment, a computer program product is provided for efficient caching of Huffman dictionaries using a processor device, in a computing environment. The non-transitory computer-readable storage medium has computer-readable program code portions stored thereon. The computer-readable program code portions include a first executable portion that uses a Huffman cache to hold the Huffman dictionaries that are changeable for dynamically selecting literal frequencies that are similar. The Huffman cache is a data storage cache.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1A:
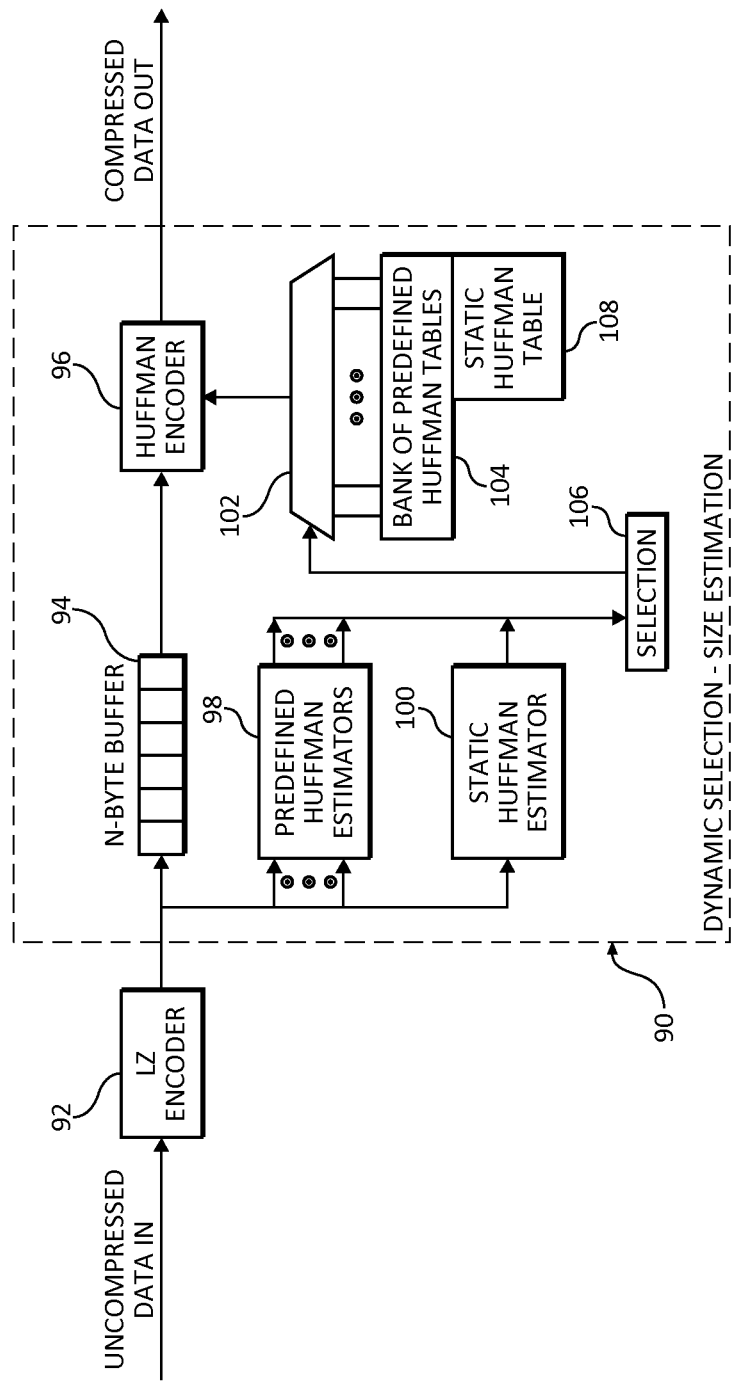
FIG. 1A is a block diagram illustrating an exemplary dynamic selection mechanism based on size estimation in which aspects of the present invention may be realized.

Deflate is a popular lossless data compression algorithm defined in Request for Comment ("RFC") 1951, entitled, "DEFLATE Compressed Data Format Specification v1.3," published by the Network Working Group in May 1996. The Deflate algorithm compresses data through a two-step process: 1) Lempel-Ziv (LZ77) coding followed by 2) Huffman coding. Deflate uses the combination of the Lempel-Ziv algorithm (LZ77), which eliminates repetitions, and Huffman coding. Huffman encoding uses a variable-length code table based on entropy to encode source symbols. It is defined either as either Static or Dynamic. In Static Huffman coding, each literal or distance is encoded using a fixed table (SHT) that is defined in the RFC. In Dynamic Huffman coding, however, special coding tables (DHT) are constructed to better suit the statistics of the data being compressed. In most cases, using DHT achieves an increased compression ratio (e.g., quality) when compared to SHT, at the expense of degrading the compression rate (e.g., performance) and adding design complexity.

Using Dynamic Huffman encoding increases the compression ratio in comparison to using Static Huffman encoding, but is typically time consuming and requires complex hardware. One solution to improve the compression ratio, while maintaining quality performance, is to analyze the first part of the incoming data stream, and speculatively select a predefined preset dictionary to be used on the entire data (instead of a generic static dictionary). A high level of correlation is found between the statistics of files with similar nature (e.g., two English text files). Such a level of correlation is exploited to compose predefined DHT presets. A matching preset yields the best of both worlds: a close-to DHT compression ratio with close-to SHT compression rate.

SHT and DHT greatly differ in their performance and quality characteristics. The "one-size fit all" approach represented by SHT compromises on the Huffman compression ratio (e.g., quality). The "personal tailoring" approach represented by DHT, on the other hand, compromises on the over-all compression rate (e.g. performance). Constructing dynamic dictionaries adds computational overhead and requires a sequential 3-step process that traverses the payload twice. The built-in trade-off between compression ratio and rate is a key usage and implementation decision point. Applications handling Internet traffic, for example, often use SHT because they cannot afford the higher latency and lower bandwidth associated with DHT. The static and dynamic Huffman encoding methods best reflect the built-in tradeoff between compression rate and ratio. The static Huffman method achieves a lower compression ratio than is possible. This is due to using a fixed encoding table regardless of the content of the input data block. For example, random data and a four-letter DNA sequence would be encoded using the same Huffman table.

The dynamic Huffman method does not have as high a compression rate as is possible. Constructing dynamic dictionaries adds computational overhead and worse, requires a sequential three step process that traverses the payload twice. In a first step, the LZ77 algorithm is performed while gathering statistics, including output literal, length and distance frequency. In a second step, statistics are used to construct the literal and length DHT and the distances DHT. Constructing a DHT requires sorting the frequencies, constructing dynamic Huffman trees, transforming it into a canonic DHT and creating a compacted form to be sent alongside the compressed data block. In a third step, the LZ77 output is encoded with the constructed DHTs. The dominant factor degrading compression rate is the second step for small input blocks and the first and third steps for larger inputs. Steps 1 and 3 traverse the payload, hence DHT is a two-pass algorithm.

The deflate algorithm partitions the input stream into blocks and every block is encoded by itself. The two-pass flow requires that intermediate block results be stored which consume several tens of kilobytes, so in software implementations they are likely to overflow to the L2 cache between steps 1 and 3. Hardware implementations, even if they supported DHT, would require either SRAMs which consume chip real estate, caches larger than L1 caches or moving all intermediate results back and forth to memory over the chip interconnect, which is likely to create bottlenecks degrading performance even more.

An explosion in network traffic has forced many edge-of-network applications, such as WAN acceleration, to use hardware accelerators. Hardware accelerators may process an input byte per cycle compared to 100 CPU cycles or so required in software implementations for the same task. These hardware accelerators commonly support dynamic Huffman decompression, but lack that support in the compression path. Settling for static Huffman encoding, as a one-pass algorithm, simplifies the hardware design and enables a high compression rate at the expense of offering a lower compression ratio.

The dictionary selection mechanism of the present invention effectively breaks the built-in tradeoff between compression ratio and rate for both software and hardware implementations. The dictionary selection mechanism achieves high compression rate and ratio leveraging predefined Huffman dictionaries (also known as presets) and provides a mechanism for dynamically speculating which predefined dictionary to select per input data block.

In one embodiment, Dynamic Huffman encoding defines two Huffman trees, one for literals and lengths and one for distances. Usage of predefined Huffman dictionaries is based on the assumption that similar data types have similar distributions for literals, lengths and distances. Literals in text files for instance will always use many alphabet letters and more vowels than consonants. This phenomenon will remain even after LZ77 repetitions are removed. It is observed that length and distance frequencies are also similar between similar file types. Nevertheless, being based on repetitions the frequency distribution is sensitive to two key parameters: the LZ77 implementation and the location of the data being compressed within the stream.

First, the LZ77 configuration used reflects the time and resources needed to find longer repetition than those already found. High effort levels do not spare resources in order to find the longest match possible, while low effort levels settle the first match that crosses a threshold (e.g., 16 B). On the other hand, a hardware implementation may use a content addressable memory (CAM)-based approach that provides the longest match possible but consumes die size, and settling on the LZ77 window size.

Second, the location of the data being compressed within the data stream defines the maximal distance a repetition can be found at. Fewer, shorter and closer repetitions are expected when the data stream begins, compared to when the LZ77 algorithm has an entire window size (e.g., 32 KB) of data available in which to look for repetitions. In one embodiment, the mechanism for dynamically selecting a predefined Huffman dictionary targets a fast decision, looking at the first N bytes alone (e.g., 12 KB). Due to the sensitivities in length and especially in distance frequencies, the dynamic selection process is constructed in large part on literals distribution. Note that this is counter intuitive, as length distance pairs comprise the majority of LZ77 output.

The usage of predefined Huffman dictionaries requires the creation of a bank of dictionaries. A process for automatically creating such a dictionary per a set of benchmarks is described below. Creating a predefined Huffman dictionary is an off-line process that typically runs before the system is built or installed or is run in the background so as to not consume real-time resources. Customers and application can create their own dictionary banks using the automatic bank creation process.

Figure 1B:
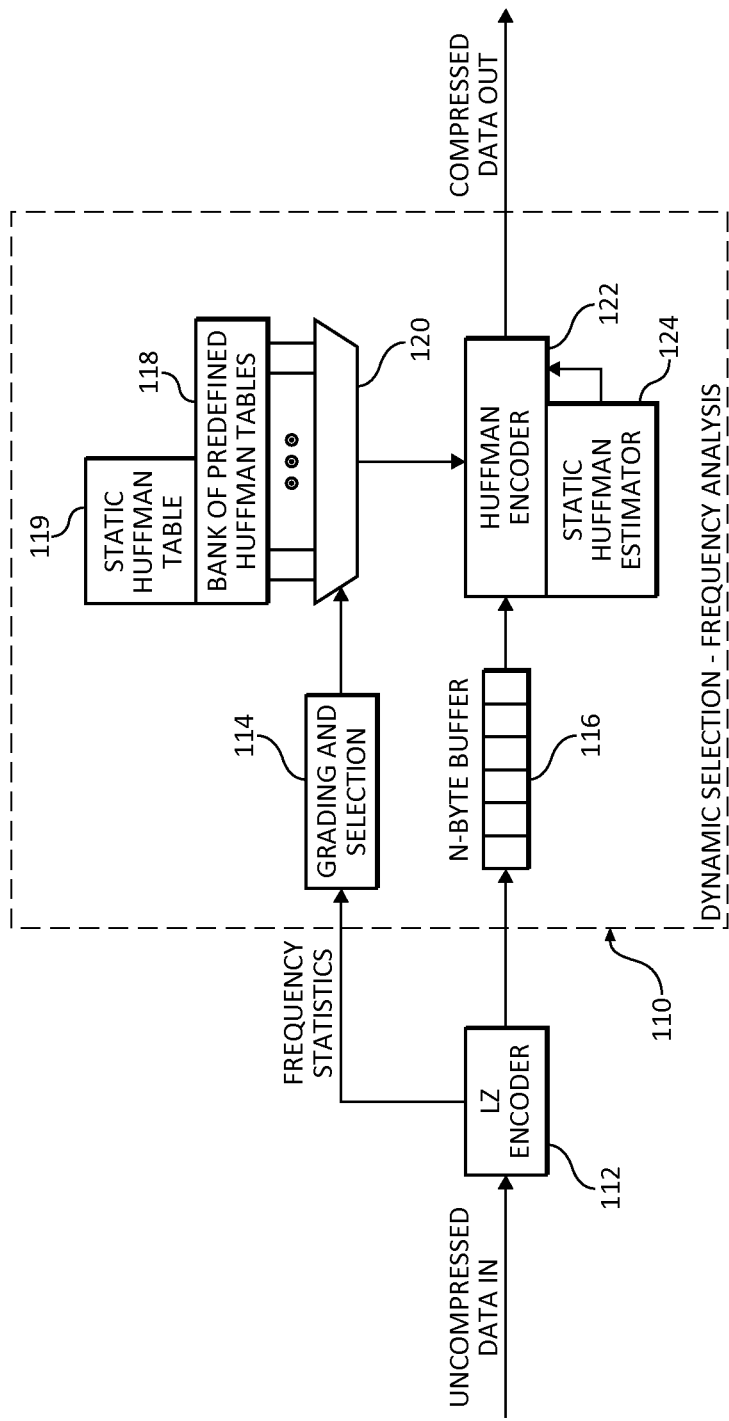
FIG. 1B is a block diagram illustrating an exemplary dynamic selection mechanism based on frequency analysis in which aspects of the present invention may be realized.

However, predefined Huffman tables are a means to achieve the close-to-SHT compression rate at close-to-DHT ratio, such as speculatively selecting one predefined dictionary out of a bank, which is described in FIGS. 1A and 1B. FIG. 1A is a block diagram illustrating an exemplary dynamic selection mechanism based on size estimation in which aspects of the present invention may be realized. In one embodiment, predefined Huffman dictionaries are generated using the mechanism of the present invention achieved close to DHT compression ratio (within 2%). Using the predefined Huffman dictionaries of the invention enables the best of both worlds by achieving ratios close to DHT compression ratios while doing so at SHT compression rates. Once the bank of dictionaries is defined, a selection is made as to which dictionary to use. Selecting an optimum predefined dictionary to use out of a bank of "K" such dictionaries (where K is a predefined number or variable reflecting the number of dictionaries) is important in that encoding data with a sub-optimal predefined Huffman dictionary is likely to degrade the compression ratio.

It should be noted that two methods of dynamic selection of predefined Huffman dictionaries within a bounded latency are provided. Two such speculative first "N" bytes techniques are presented. In operation, statistics are gathered on the first LZ-processed N bytes of every input data block wherein it is speculated that the rest of the block will be similar. Introducing an upper decision bound (N) limits both the latency delay and the hardware implementation cost (assuming a hardware accelerator implementation). Two such speculative first N bytes techniques are presented. In a first technique, calculations of all the potential output sizes are performed before choosing the minimal one. The dynamic selection block, generally referenced 90, comprises an N-byte buffer 94 fed by the output of the repetition removal algorithm 92 (LZ77 in this example), Huffman encoder 96 which outputs the compressed data, predefined Huffman estimators 98, static Huffman estimator 100, selection logic block 106, bank of predefined Huffman dictionaries 104, static Huffman table (SHT) 108 and multiplexer 102.

In operation, the output of the repetition removal algorithm (LZ77 component) 92 is fed to K+1 size estimators 98, 100, one per predefined dictionary including one for SHT. Note that a size estimator is not a full Huffman encoder, as it only calculates the number of output bits required, without encoding and saving the output. When the N-byte buffer 94 is full, a selector unit 106 reads all the calculated sizes and chooses the predefined dictionary that generated the minimal output, e.g., the size counters are examined and the dictionary corresponding to the lowest value is considered optimal.

Once a predefined dictionary is selected, the Huffman encoder begins working in parallel to the LZ77 component. This creates a pipeline, in which data is both extracted from the buffer by the encoder and inserted into it by the LZ77 component that continues to byte N+1 and beyond. This process repeats per compression block and can be further optimized so that the delay associated with filling the N byte buffer does not degrade the overall throughput. This requires enhancing the pipeline so that the LZ77 component may work on the next block while the Huffman encoder still processes the current one.

Note that this brute-force dynamic selector method is speculative because only N bytes out of the block's content (LZ77 output) are evaluated. There is no guarantee that the dictionary associated with the minimal size for N will have the minimal size for the entire block. It is speculated (assumed) that the remainder of the compression block has similar characteristics to the first N bytes. Using bigger values of N, makes the method less speculative, but consumes more resources and adds delay. In any case, regardless of the predefined dictionary selected, the Huffman encoding phase begins once a predefined dictionary is chosen. Data is extracted from the buffer 94 by the encoder 96. Data is inserted into the buffer by the LZ77 component that continues to byte N+1 and beyond. This process repeats per input compression block.

In a second technique, a predefined dictionary is chosen based on the observed frequencies over N first bytes of a buffer. The dynamic selection block, generally referenced 110, comprises an N-byte buffer 116 fed from the output of repetition removal algorithm 112 (LZ77 encoder in this example), grading and selection block 114, bank of predefined Huffman dictionary tables 118, static Huffman table 119, multiplexer 120, Huffman encoder for generating compressed output data and static Huffman estimator 124.

In the frequency-based analysis dynamic selector method, the output of the repetition removal algorithm (e.g., LZ77 component) is stored in an intermediate buffer 116. Once N bytes are accumulated, literal, length and distance frequency statistics, which were generated (e.g., counted) in performing the repetition removal (LZ77) algorithm, are passed to a selector (grading circuit) 114. The frequency-based analysis selector chooses a predefined dictionary based on a compatibility grade per predefined dictionary and Huffman encoding begins. In one embodiment a static Huffman size estimator (124) is also used and its purpose is to detect abnormalities, in which SHT outperforms the chosen predefined dictionary for the first N bytes. If this is the case, the compression accelerator may: (1) re-encode the data in the buffer 116 (providing it is still there); or (2) decide to partition the input stream and start a new block, switching to SHT encoding. Note that the latter option does not have to support replay (which degrades performance), but does suffer from a limited compression ratio loss. Leaving the static Huffman estimator 124 out of the mechanism altogether is also an option but the compression ratio loss will be greater in such cases.

However, FIGS. 1A and 1B do not discuss how to create the predefined dictionaries in the first place. Such an automatic method for creating predefined Huffman dictionaries is especially important in "in-bound" predefined dictionaries methods, in which the encoding side uses the DHT mode and transmits the compacted DHT so it is absolutely free to define the predefined dictionaries per customer, operational environment and even every timeslot. In order to do so the following may be employed with some drawbacks and challenges: 1) compromise on compression rate by using DHT, 2) compromise on compression ratio by using SHT, and/or 3) compromise on compression ratio and modify legacy decoders and manually create predefined dictionaries and hang the RFC. However, changing the RFC and using out-of band signals means that the solution will not work with every decoder. Moreover, it reduces the problem from per user/customer, environment, and time slot to a one-time effort, but does not eliminate it. It also degrades compression ratio (i.e. one size fits all approach). Significantly reducing the number of predefined dictionaries that has to be prepared allows for manually creating the predefined dictionaries.

Thus, to address these inefficiencies and for increasing computing efficiency, the present invention produces the most efficient predefined dictionary for retaining a minimal CPU utilization. A caching mechanism of DHT dictionaries is employed. Using a DHT solution, each block of data is tallied for literals frequency, and these frequencies are then inserted into a priority queue and/or heap, then sorted, and then a binary tree is created and a Huffman tree/dictionary is created. Prior to the "heavy lifting" of building the Huffman dictionary (e.g., consumption of significant computing resources and computing time for building the Huffman dictionary) the embodiments described herein are introduced, immediately after the frequencies are tallied, and the frequencies are quantified into a triple key cache: a frequencies hash, a number of literals, and a dictionary). Thus, the Huffman cache of the present invention, significantly improves computing time, hitting the cache for matching a Huffman dictionary instead of building the dictionary using the frequencies. The present invention is especially important for real-time compression approaches, where rate is more important than ratio.

Figure 2:
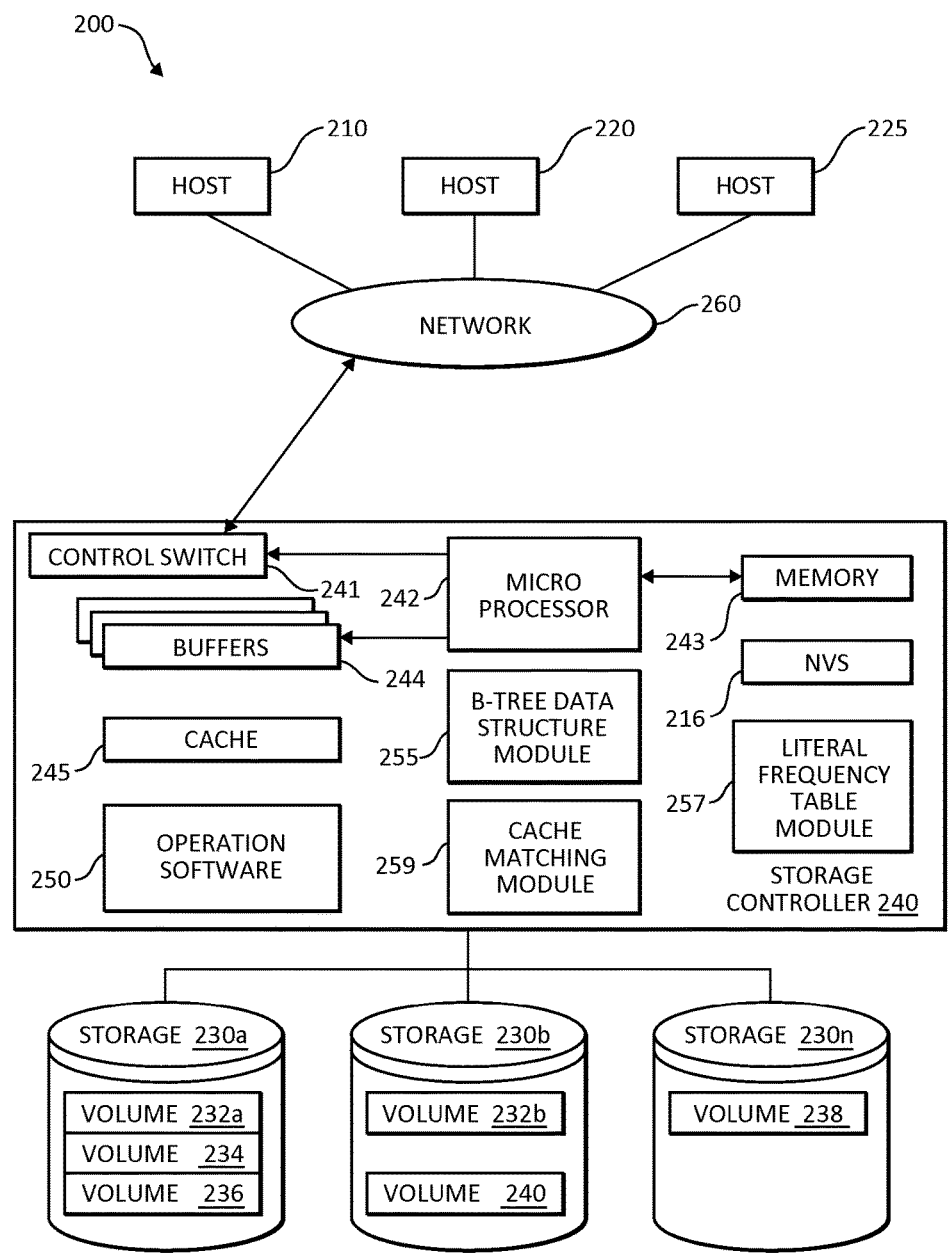
FIG. 2 is a block diagram illustrating a hardware structure of data storage system in a computer system in which aspects of the present invention may be realized.

FIG. 2 is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. In one embodiment, by way of example only, a data storage system 200 may be implemented as IBM® ProtecTIER® deduplication system TS7650G™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adaptor 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216. It is noted that in some embodiments, storage controller 240 is comprised of multiple processing units, each with their own processor complex and system memory, and interconnected by a dedicated network within data storage system 200. Storage 230 (labeled as 230a, 230b, and 230n in FIG. 3) may be comprised of one or more storage devices, such as storage arrays, which are connected to storage controller 240 (by a storage network) with one or more cluster hosts 210, 220, and 225 connected to each storage controller 240.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps of the present invention for executing and managing storage 230 as described herein. In one embodiment, system memory 243 includes, is in association with, or is in communication with the operation software 250 for performing methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and nonvolatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a B-Tree Data structure module 255, a literal frequency table module 257, and a cache-matching module 259. The B-Tree Data structure module 255, a literal frequency table module 257, and the cache-matching module 259 may work in conjunction with each and every component of the storage controller 240, the hosts 210, 220, 225, and storage devices 230. The B-Tree Data structure module 255, the literal frequency table module 257, and the cache-matching module 259 may be structurally one complete module or may be associated and/or included with other individual modules. The B-Tree Data structure module 255, the literal frequency table module 257, and the cache-matching module 259 may also be located in the cache 245 or other components.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control, cache 245 for temporarily storing (buffering) data, and buffers 244 for assisting the cache 245 to read and write data, a control switch 241 for controlling a protocol to control data transfer to or from the B-Tree Data structure module 255, the literal frequency table module 257, and the cache-matching module 259, in which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network (this could be a fibre channel) 260 as an interface i.e., via at least one switch called "fabric." In one embodiment, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, B-Tree Data structure module 255, the literal frequency table module 257, and the cache-matching module 259 are in communication with each other and may be separate or one individual component(s). Also, several, if not all of the components, such as the operation software 250 may be included with the memory 243. Each of the components within the devices shown may be linked together and may be in communication with each other for purposes suited to the present invention. As mentioned above, the B-Tree Data structure module 255, the literal frequency table module 257, and the cache-matching module 259 may also be located in the cache 245 or other components. As such, the B-Tree Data structure module 255, the literal frequency table module 257, and the cache-matching module 259 maybe used as needed, based upon the storage architecture and users preferences.

In one embodiment, the present invention uses a data storage cache (e.g., a Huffman cache) to hold changeable Huffman compression dictionaries/tables, and selects based on similar matching (such as M out of N matches for most frequent and least frequent). In one embodiment, the present invention creates a cache of Huffman trees (e.g., a dynamic cache of Huffman trees) and detects the cache matches on the fly. In one embodiment, the present invention generates DHT upon a cache miss, and the present invention caches the Huffman dictionary for faster compression.

Figure 3:
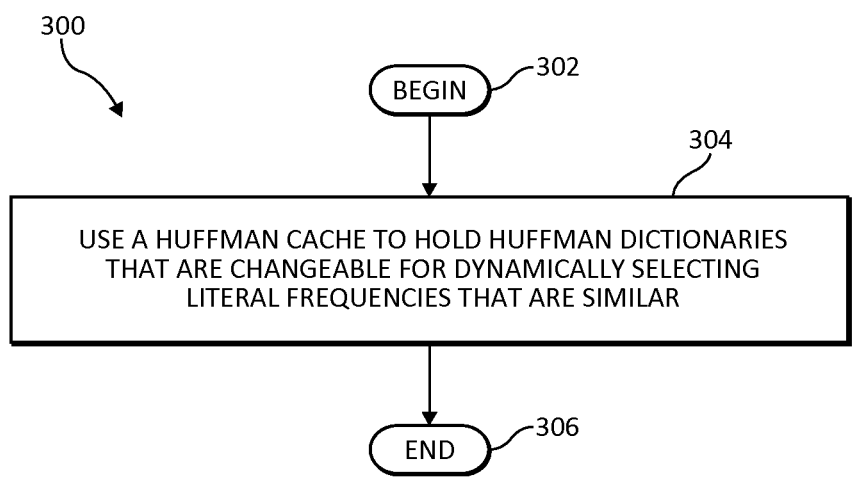
FIG. 3 is a flowchart illustrating an exemplary method for efficient caching of Huffman dictionaries in a computing environment in which aspects of the present invention may be realized.

Creating a Huffman cache is achieved by introducing a new process into a DHT creation, as illustrated in FIG. 3. FIG. 3 is a flowchart illustrating an exemplary method 300 for efficient caching of Huffman dictionaries in a computing environment in which aspects of the present invention may be realized. The method 300 begins (step 302). The method 300 use a Huffman cache to hold Huffman dictionaries that are changeable for dynamically selecting literal frequencies that are similar (e.g., a approximation of cache match) (step 304). The Huffman cache is a data storage cache. The method 300 ends (step 306).

Figure 4:
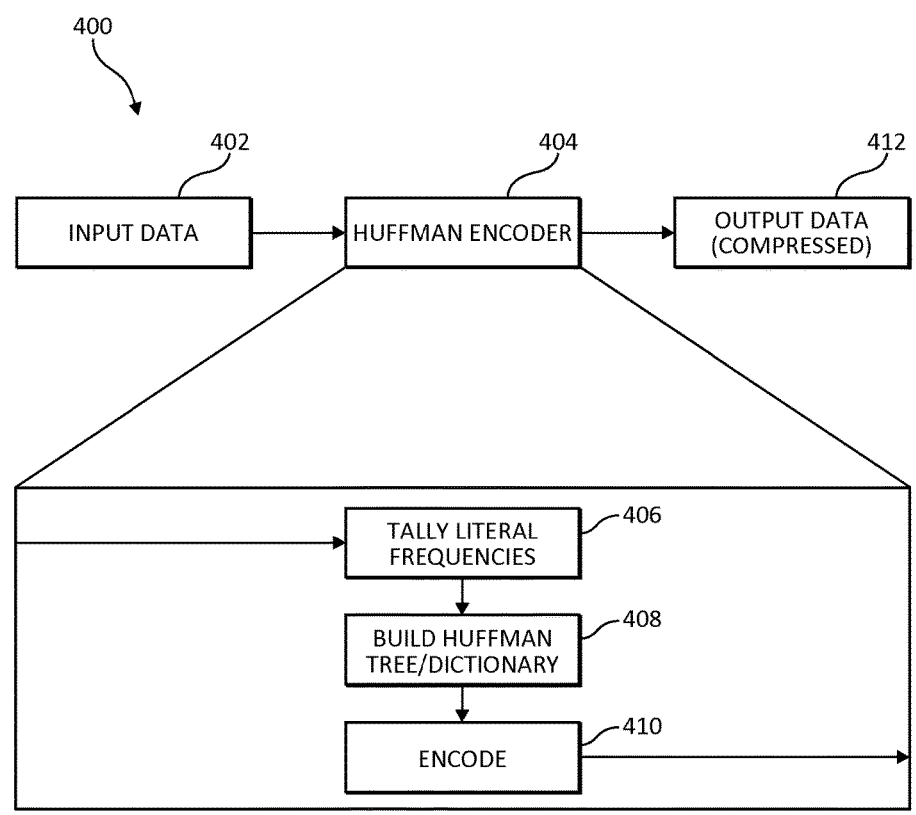
FIG. 4 is a flowchart illustrating an exemplary method for using a new DHT process in a DHT creation in which aspects of the present invention may be realized.

The creating a Huffman cache is achieved by introducing a new DHT process into the DHT creation as defined in FIG. 4, and the Huffman cache as outlined in FIG. 5, below. FIG. 4 is a flowchart illustrating an exemplary method 400 for using a new DHT process in a DHT creation in which aspects of the present invention may be realized. The method 400 beings with input data (step 402). The method 400 sends the input data to a Huffman encoder (step 404). At this point, the method 400 tallies literal frequencies (step 406), builds a Huffman tree/Huffman dictionary (step 408), and encodes the data (step 410). The method 400 then receives the output data, which has been compressed (step 412).

Figure 5:
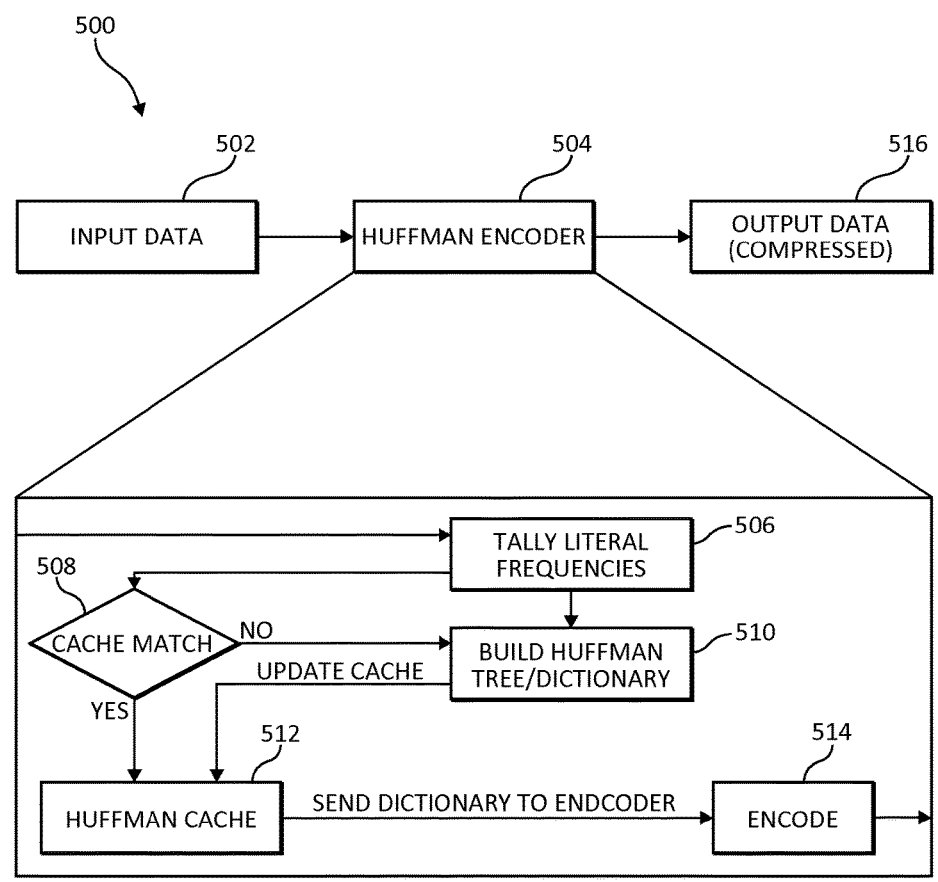
FIG. 5 is a flowchart illustrating an additional exemplary method for creating a Huffman cache in which aspects of the present invention may be realized.

FIG. 5 is a flowchart illustrating an additional exemplary method 500 for creating a Huffman cache in which aspects of the present invention may be realized. The method 500 beings with input data (step 502). The method 500 sends the input data to a Huffman encoder (step 504). At this point, the method 500 tallies literal frequencies (step 506). The method 500 determines if there is a cache match (step 508). If no, the method 500 builds a Huffman tree/Huffman dictionary (step 510). From both step 510, and also if there is a cache match from step 508, the method 500 then sends the cache match to a Huffman cache and/or updates the Huffman cache with the built Huffman tree/Huffman dictionary (step 512). The method 500 then sends the Huffman dictionary to an encoder to encode the data (step 514). The method 500 then receives the output data, which has been compressed (step 516).

It should be noted that since each block of data usually produces slightly different literal frequencies, if the data is of the same type—it produces similar frequencies but usually not identical and historically a match could not be made as is. However, in one embodiment, as illustrated in FIG. 5, the cache matching process is performed by comparing and matching similar literal frequencies for higher cache hit. By generalizing the frequency table, a match approximation procedure is created for the cache entries. For example, a "N" most frequent literals may be used as a hash key for the cache matching.

Moreover, the literal frequencies are tallied for each block of data and then the literal frequencies are inserted and sorted into a priority queue. After tallying the literal frequencies, a B-Tree and a Huffman dictionary are created. Each of the literal frequencies are quantified into a triple key cache. The triple key cache includes key for each one of a number of literals, a dictionary and a hash for the literal frequencies. Also, the N most frequent literals (e.g., N most similar frequent literals) are used as a hash key for cache matching.

For performing a cache matching operation, the literal frequencies are tallied for each block of data for generalizing a frequency table with the similar literal frequencies. The similar literal frequencies are compared and matched for achieving an increased cache hit ratio for each cache entry. Also, a determination is made if there is a cache match using the similar literal frequencies. A B-Tree and a Huffman dictionary are created if there is not a cache match. The Huffman cache is updated with the created B-Tree and the Huffman dictionary, and then the Huffman dictionary is encoded.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, fieldprogrammable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for efficient caching of Huffman dictionaries using a processor device in a computing environment, comprising:

using a Huffman cache to hold the Huffman dictionaries that are changeable for dynamically selecting literal frequencies that are similar, the literal frequencies comprising a number of times each of a plurality of literals is used in input data and each of the plurality of literals comprising a sequence of bytes representing characters of the input data, wherein the Huffman cache is a data storage cache;

quantifying each of the literal frequencies into triple key cache, wherein the triple key cache includes keys for each one of a number of literals, a dictionary and a hash for the literal frequencies; and wherein the literal frequencies are used to determine a cache match of a respective one of the Huffman dictionaries for the input data to improve computational time in lieu of building the respective one of the Huffman dictionaries using the literal; and encoding the respective one of the Huffman dictionaries of the input data to produce compressed output data such that the input data is encoded at both a compression ratio commensurate with a dynamic Huffman encoding operation while simultaneously encoding the input data at a compression rate commensurate with a static Huffman encoding operation; wherein the respective one of the Huffman dictionaries of the input data is encoded in one pass consistent with the compression rate of the static Huffman encoding operation in lieu of performing the encoding in a dual-pass encoding consistent with the compression ratio of the dynamic Huffman encoding operation while maintaining both the compression rate of the static Huffman encoding operation in addition to the compression ratio of the dynamic Huffman encoding operation.

2. The method of claim 1, further including tallying the literal frequencies for each block of data.

3. The method of claim 2, further including inserting and sorting the literal frequencies into a priority queue.

4. The method of claim 3, further including creating a B-Tree and a Huffman dictionary following the tallying.

5. The method of claim 1, further including using N most frequent literals as a hash key for the cache matching.

6. The method of claim 1, further including performing a cache matching operation by performing each one of:
  tallying the literal frequencies for each block of data for generalizing a frequency table with the similar literal frequencies,
  comparing and matching the similar literal frequencies for achieving an increased cache hit ratio for each cache entry,
  determining if there is the cache match using the similar literal frequencies,
  creating a B-Tree and the respective one of the Huffman dictionaries if no cache match is determined and subsequently updating the Huffman cache with the created B-Tree and the respective one of the Huffman dictionaries, and
  encoding the respective one of the Huffman dictionaries.

7. A system for efficient caching of Huffman dictionaries using a processor device in a computing environment, the system comprising:
  at least one processor device operable in the computing storage environment for controlling the caching of Huffman dictionaries, wherein the at least one processor device:
    uses a Huffman cache to hold the Huffman dictionaries that are changeable for dynamically selecting literal frequencies that are similar, the literal frequencies comprising a number of times each of a plurality of literals is used in input data and each of the plurality of literals comprising a sequence of bytes representing characters of the input data, wherein the Huffman cache is a data storage cache,
    quantifies each of the literal frequencies into triple key cache, wherein the triple key cache includes keys for each one of a number of literals, a dictionary and a hash for the literal frequencies; and wherein the literal frequencies are used to determine a cache match of a respective one of the Huffman dictionaries for the input data to improve computational time in lieu of building the respective one of the Huffman dictionaries using the literal, and
    encoding the respective one of the Huffman dictionaries of the input data to produce compressed output data such that the input data is encoded at both a compression ratio commensurate with a dynamic Huffman encoding operation while simultaneously encoding the input data at a compression rate commensurate with a static Huffman encoding operation; wherein the respective one of the Huffman dictionaries of the input data is encoded in one pass consistent with the compression rate of the static Huffman encoding operation in lieu of performing the encoding in a dual-pass encoding consistent with the compression ratio of the dynamic Huffman encoding operation while maintaining both the compression rate of the static Huffman encoding operation in addition to the compression ratio of the dynamic Huffman encoding operation.

8. The system of claim 7, wherein the at least one processor device tallies the literal frequencies for each block of data.

9. The system of claim 8, wherein the at least one processor device inserts and sorts the literal frequencies into a priority queue.

10. The system of claim 9, wherein the at least one processor device creates a B-Tree and a Huffman dictionary following the tallying.

11. The system of claim 7, wherein the at least one processor device uses N most frequent literals as a hash key for the cache matching.

12. The system of claim 7, wherein the at least one processor device performs a cache matching operation by performing each one of:
  tallying the literal frequencies for each block of data for generalizing a frequency table with the similar literal frequencies,
  comparing and matching the similar literal frequencies for achieving an increased cache hit ratio for each cache entry,
  determining if there is the cache match using the similar literal frequencies,
  creating a B-Tree and the respective one of the Huffman dictionaries if no cache match is determined and subsequently updating the Huffman cache with the created B-Tree and the respective one of the Huffman dictionaries, and
  encoding the respective one of the Huffman dictionaries.

13. A non-transitory computer-readable storage medium having computer-readable program code portions stored therein, the computer-readable program code portions comprising executable instructions for efficient caching of Huffman dictionaries using a processor device in a computing environment comprising:
  a first executable portion that:
    uses a Huffman cache to hold the Huffman dictionaries that are changeable for dynamically selecting literal frequencies that are similar, the literal frequencies comprising a number of times each of a plurality of literals is used in input data and each of the plurality of literals comprising a sequence of bytes representing characters of the input data, wherein the Huffman cache is a data storage cache;
    quantifies each of the literal frequencies into triple key cache, wherein the triple key cache includes keys for each one of a number of literals, a dictionary and a hash for the literal frequencies; and wherein the literal frequencies are used to determine a cache match of a respective one of the Huffman dictionaries for the input data to improve computational time in lieu of building the respective one of the Huffman dictionaries using the literal; and encoding the respective one of the Huffman dictionaries of the input data to produce compressed output data such that the input data is encoded at both a compression ratio commensurate with a dynamic Huffman encoding operation while simultaneously encoding the input data at a compression rate commensurate with a static Huffman encoding operation; wherein the respective one of the Huffman dictionaries of the input data is encoded in one pass consistent with the compression rate of the static Huffman encoding operation in lieu of performing the encoding in a dual-pass encoding consistent with the compression ratio of the dynamic Huffman encoding operation while maintaining both the compression rate of the static Huffman encoding operation in addition to the compression ratio of the dynamic Huffman encoding operation.

14. The non-transitory computer-readable storage medium of claim 13, further including a second executable portion that tallies the literal frequencies for each block of data.

15. The non-transitory computer-readable storage medium of claim 14, further including a third executable portion that inserts and sorts the literal frequencies into a priority queue.

16. The non-transitory computer-readable storage medium of claim 15, further including a fourth executable portion that creates a B-Tree and a Huffman dictionary following the tallying.

17. The non-transitory computer-readable storage medium of claim 13, further including a second executable portion that uses N most frequent literals as a hash key for the cache matching.

18. The non-transitory computer-readable storage medium of claim 13, further including a second executable portion that performs a cache matching operation by performing each one of:
 tallying the literal frequencies for each block of data for generalizing a frequency table with the similar literal frequencies,
 comparing and matching the similar literal frequencies for achieving an increased cache hit ratio for each cache entry,
 determining if there is the cache match using the similar literal frequencies,
 creating a B-Tree and the respective one of the Huffman dictionaries if no cache match is determined and subsequently updating the Huffman cache with the created B-Tree and the respective one of the Huffman dictionaries, and
 encoding the respective one of the Huffman dictionaries.

* * * * *